United States Patent
Re Fiorentin et al.

(10) Patent No.: US 11,940,492 B2
(45) Date of Patent: Mar. 26, 2024

(54) TEST ARCHITECTURE FOR ELECTRONIC CIRCUITS, CORRESPONDING DEVICE AND METHOD

(71) Applicant: STMicroelectronics S.r.l., Agrate Brianza (IT)

(72) Inventors: Lorenzo Re Fiorentin, Turin (IT); Giampiero Borgonovo, Giussano (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 17/656,538

(22) Filed: Mar. 25, 2022

(65) Prior Publication Data

US 2022/0317186 A1 Oct. 6, 2022

(30) Foreign Application Priority Data

Mar. 30, 2021 (IT) .................. 102021000007856

(51) Int. Cl.
*G01R 31/3181* (2006.01)
*G01R 31/3183* (2006.01)
(Continued)

(52) U.S. Cl.
CPC .......... *G01R 31/31813* (2013.01); *G01R 31/318307* (2013.01); *G01R 31/318385* (2013.01);
(Continued)

(58) Field of Classification Search
CPC ...... G01R 31/31813; G01R 31/318307; G01R 31/318385; G01R 31/318536; G01R 31/318547; G01R 31/3187
(Continued)

(56) References Cited

U.S. PATENT DOCUMENTS 5,991,909 A * 11/1999 Rajski ............ G01R 31/318385
714/729
6,148,425 A * 11/2000 Bhawmik .......... G01R 31/3016
714/724
(Continued)

OTHER PUBLICATIONS

Abdulla, M.F., et al., "A Novel BIST Architecture With Built-in Self Check," 9th International Conference on VLSI Design, Jan. 1996, 4 pages.
(Continued)

*Primary Examiner* — John J Tabone, Jr.
(74) *Attorney, Agent, or Firm* — Slater Matsil, LLP

(57) ABSTRACT

Test stimulus signals applied to at least one circuit under test are produced in a set of test stimulus generators as a function of test stimulus information loaded in test stimulus registers. Loading of the test stimulus information in the test stimulus registers is controlled as a function of test programming information loaded via a programming interface in a respective control register in a set of control registers. The test stimulus generators are activated as a function of the test programming information loaded in said control registers. Test outcome signals received from the at least one circuit under test are used to produce signature comparison signals, which are compared with respective programmable signature reference signals stored in a set of input signature registers, are produced in response to the signature comparison signals produced from the test outcome signals failing to match with the respective reference signals.

20 Claims, 5 Drawing Sheets

(51) Int. Cl.
    *G01R 31/3185*     (2006.01)
    *G01R 31/3187*     (2006.01)

(52) U.S. Cl.
    CPC ............ *G01R 31/318536* (2013.01); *G01R 31/318547* (2013.01); *G01R 31/3187* (2013.01)

(58) Field of Classification Search
    USPC ....... 714/726, 727, 728, 729, 724, 733, 736, 714/738, 739, 742
    See application file for complete search history.

(56) References Cited

U.S. PATENT DOCUMENTS

| | | | | |
|---|---|---|---|---|
| 6,694,466 | B1* | 2/2004 | Tsai | G01R 31/318544 714/728 |
| 6,715,105 | B1* | 3/2004 | Rearick | G01R 31/318547 714/732 |
| 6,789,220 | B1* | 9/2004 | Lovejoy | G01R 31/31921 714/739 |
| 6,950,974 | B1* | 9/2005 | Wohl | G01R 31/318547 714/728 |
| 7,155,648 | B2* | 12/2006 | Jas | G01R 31/318547 714/732 |
| 10,746,790 | B1* | 8/2020 | Cook Lobo | G01R 31/31724 |
| 10,969,433 | B1* | 4/2021 | Nerukonda | G06F 9/30134 |
| 2003/0070118 | A1* | 4/2003 | Nakao | G01R 31/318547 714/30 |
| 2003/0097614 | A1* | 5/2003 | Rajski | G01R 31/31858 714/30 |
| 2005/0138509 | A1* | 6/2005 | Kiryu | G01R 31/318566 714/726 |
| 2006/0080585 | A1* | 4/2006 | Kiryu | G01R 31/3177 714/733 |
| 2007/0011537 | A1* | 1/2007 | Kiryu | G01R 31/318547 714/733 |
| 2007/0214398 | A1* | 9/2007 | Zhang | G01R 31/318371 714/728 |
| 2008/0052581 | A1* | 2/2008 | Douskey | G01R 31/318558 714/733 |
| 2008/0276144 | A1* | 11/2008 | Huben | G01R 31/318385 714/733 |
| 2009/0210763 | A1* | 8/2009 | Eckelman | G01R 31/318536 714/E11.002 |
| 2010/0218059 | A1* | 8/2010 | Gangasani | G01R 31/318385 714/728 |
| 2014/0006889 | A1* | 1/2014 | Motika | G06F 11/27 714/E11.155 |
| 2014/0053034 | A1 | 2/2014 | Harper et al. | |
| 2014/0053035 | A1* | 2/2014 | Harper | G01R 31/3177 714/733 |
| 2014/0149818 | A1* | 5/2014 | Adams | G11C 29/12015 714/733 |
| 2016/0349314 | A1* | 12/2016 | Dubrova | G01R 31/318335 |
| 2018/0067164 | A1* | 3/2018 | Maheshwari | G01R 31/31725 |
| 2018/0074122 | A1* | 3/2018 | Payne | H03K 3/0375 |
| 2019/0041459 | A1* | 2/2019 | Simpson | G01R 31/318335 |
| 2019/0113566 | A1* | 4/2019 | Maheshwari | G01R 31/31703 |
| 2022/0317186 | A1* | 10/2022 | Re Fiorentin | G01R 31/31813 |

OTHER PUBLICATIONS

McLaurin, T., "Periodic Online LBIST Considerations for a Multicore Processor," 2018 IEEE International Test Conference in Asia, Aug. 15-17, 2018, 6 pages.

* cited by examiner

TEST ARCHITECTURE FOR ELECTRONIC CIRCUITS, CORRESPONDING DEVICE AND METHOD

CROSS-REFERENCE TO RELATED APPLICATIONS

This application claims priority to Italian Application No. 102021000007856, filed on Mar. 30, 2021, which application is hereby incorporated herein by reference in its entirety.

TECHNICAL FIELD

The present application relates to testing electronic circuits, and, in particular embodiments, to Logic Built-In Self-Test (LBIST) architectures.

BACKGROUND

Today, in sectors such as the automotive sector, electronics are no longer used only for implementing onboard comfort features. Electronics are now extensively involved in implementing passive/active safety systems with the aim of preventing, or at least reducing, harm to the driver and passenger(s): the related functions may involve functions such as, for instance, forward collision warning, blind spot monitoring, automatic emergency braking, airbag and ABS features and so on.

This scenario underlies the adoption of specifications such as the ISO 26262 standard as applied to designing automotive electronics in order to provide a common basis to evaluate and document safety levels in electrical and electronics (E/E) systems.

Adequately satisfying safety specifications such as ISO 26262, is facilitated by periodic online testing with the aim of detecting possible faults in the safety mechanisms implemented, latent point faults (LPFs) or single point faults (SPFs) in functional logic blocks.

Despite the extensive activity in that area, products such as, for instance, SoCs, and other products for the automotive market may benefit from an availability of configurable online BIST mechanisms able to test a variety of hardware (HW) safety mechanisms in an efficient way.

SUMMARY

One or more embodiments of the present application contribute to providing a highly configurable LBIST architecture for online/offline testing of (sub)systems.

One or more embodiments may relate to a corresponding device. A semiconductor device such as a SoC including self-test control architecture as illustrated herein (possibly in conjunction with associated scan-chain circuitry) may be exemplary of such a device.

One or more embodiments may relate to a corresponding method.

One or more embodiments may provide one or more of the following advantages. An adequate trade-off in terms of area cost versus performance target (test coverage, test time) can be reached selecting (static) configuration parameters. Integration in multiple simple/complex digital sub-systems for full/partial on-line LBIST testing of systems and sub-systems may be achieved. A full set of safety design/circuitry or just a programmable/configurable subset can be involved in testing. One or more test sessions can be triggered at run-time (e.g., via software) with reduced area overhead. The modules involved in a test session can be tested sequentially or in parallel; this level of configurability facilitates reaching an adequate trade-off in terms of area, test-time and coverage for various situations. As a side result, general "rules of thumb" for correct system sizing can be obtained.

BRIEF DESCRIPTION OF THE DRAWINGS

One or more embodiments will now be described, by way of example only, with reference to the annexed figures, wherein.

DETAILED DESCRIPTION OF ILLUSTRATIVE EMBODIMENTS

Figure 1A:
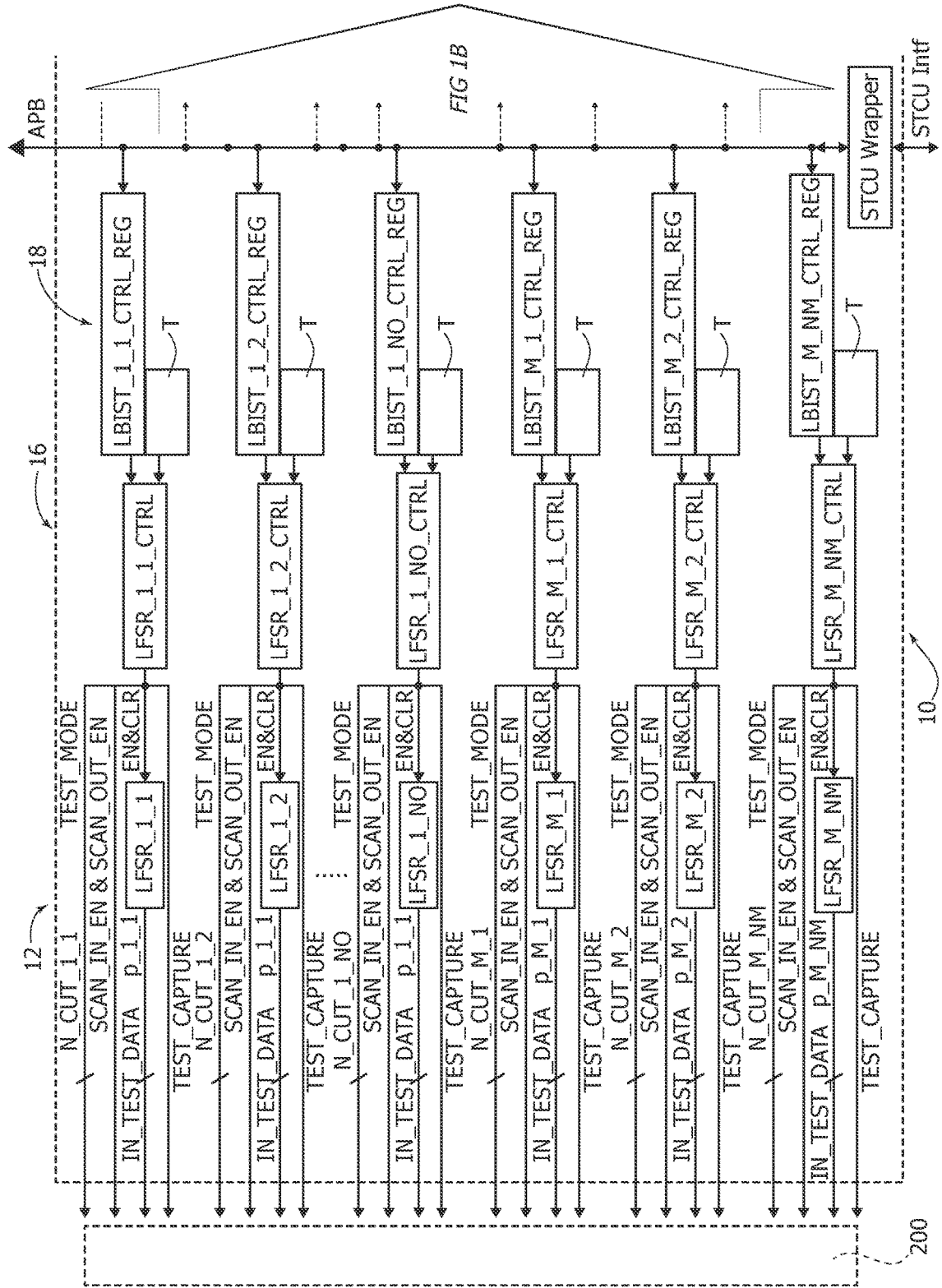
FIGS. 1A and 1B jointly represent a block diagram of circuit architecture according to embodiments of the present description.

In the ensuing description, one or more specific details are illustrated, aimed at providing an in-depth understanding of examples of embodiments of this description. The embodiments may be obtained without one or more of the specific details, or with other methods, components, materials, etc. In other cases, known structures, materials, or operations are not illustrated or described in detail so that certain aspects of embodiments will not be obscured.

Reference to "an embodiment" or "one embodiment" in the framework of the present description is intended to indicate that a particular configuration, structure, or characteristic described in relation to the embodiment is comprised in at least one embodiment. Hence, phrases such as "in an embodiment" or "in one embodiment" that may be present in one or more points of the present description do not necessarily refer to one and the same embodiment.

Moreover, particular conformations, structures, or characteristics may be combined in any adequate way in one or more embodiments.

The headings/references used herein are provided merely for convenience and hence do not define the extent of protection or the scope of the embodiments.

Various acronyms are used for brevity throughout this description.

While known to those of skill in the art, a number of these acronyms is reproduced below together with their meaning for immediate reference.

LBIST=Logic Built-In Self-Test
SoC=System on Chip
IP=Intellectual Property (core or block: a reusable unit of logic, cell, or integrated circuit layout design)
CAD=Computer-Aided Design
CUT=Circuit Under Test
LFSR=Linear-Feedback Shift Register
MISR=Multiple Input Signature Register
ECC=Error Correction Code
FCU=Fault Collection Unit
SPF=Single Point Fault
LPF=Latent Point Fault EDPA=Enhanced Data Processing Architecture
RTL=Register-Transfer Level
EOC=End of Counter One or more embodiments provide (circuit) architecture for periodic online/offline LBIST operation.

Static and dynamic configurability of the architecture makes it suitable for use in testing various types of digital blocks (combinatorial or sequential).

This also applies to complex blocks (e.g., sub-systems with many logic gates and memory elements).

Moreover, one or more embodiments can handle concurrently (in an efficient way in terms of hardware involved) different types of circuits under test (CUTs) and a different number of instances-per type which may be present in a single IP or an entire SoC.

It will be appreciated that, as used herein, the designation "circuit under test" (hence, the wording "at least one" circuit under test) can apply to multiple instances of different DUTs (designs under test) with different complexity and mutually (totally) independent (e.g., belonging to different sub-systems, design units etc. in a device).

One or more embodiments involve a reduced area overhead. This also facilitates applying a runtime LBIST feature to small logic blocks such as ECC check/correction and generation ones. These are currently present in various automotive IPs and may be affected by latent faults.

Nowadays, various CAD vendors propose proprietary solutions to automatically insert LBIST schemes in SoCs or IPs.

Despite the flexibility which underlies designing and generating LBIST schemes, LBIST schemes generated and inserted automatically may not be able to provide concurrent tests using a single LFSR and internal controller for different types of CUTs.

Such limitations militate against a satisfactory trade-off between parameters such as area overhead, test coverage and time. This may be the case when CUTs are not particularly complex (e.g., logic blocks to generate and check different types of ECC schemes).

A highly configurable LBIST scheme as discussed herein is able, thanks to its (static/dynamic) flexibility, to handle both complex and simple CUTs which may be present in an IP or in a SoC.

One or more embodiments are based on hierarchical architecture comprising different types of sub-blocks, each dedicated to a particular functionality, whose number and internal parallelism can be configured (statically) during a configuration or design phase, via (static) RTL parameters. Also, internal connections and their parallelism can automatically change according to the values set for design parameters.

Figure 1B:
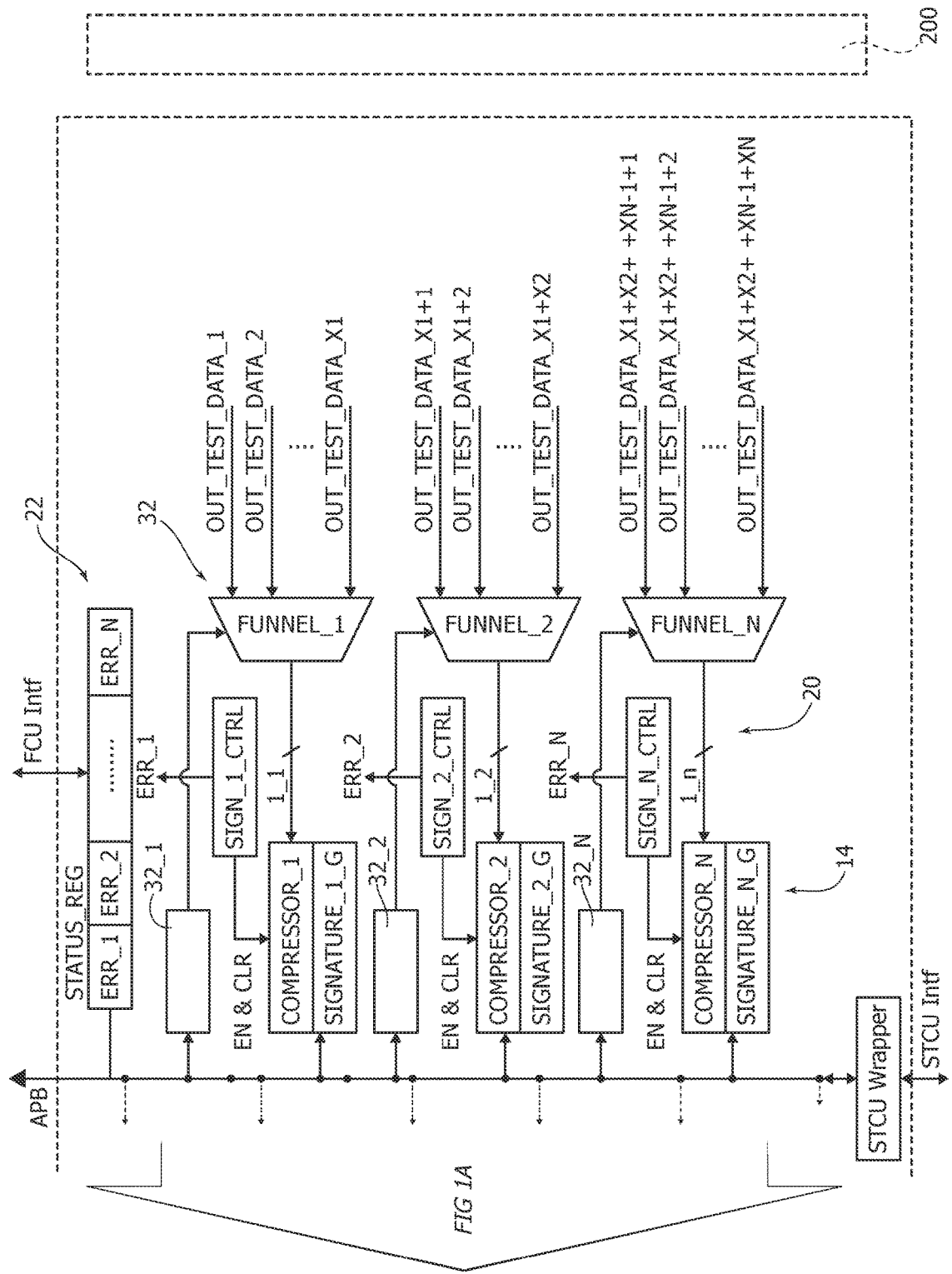

Architecture as illustrated in FIGS. 1A and 1B is structured around an Advanced Peripheral Bus (APB) and is intended to co-operate with a Fault Collection Unit interface (FCU Intf.) and a Self-Test Control Unit interface (STCU Intf.)

As illustrated on the left-hand side of FIG. 1A, test stimuli for (at least) one circuit under test (200—see also FIG. 3 and the related discussion in the following) are pseudo-randomly generated using a certain number of LFSRs (LFSR_1_1, LFSR_1_2, . . . , LFSR_M_NM) collectively designated 12.

As discussed previously, the designation "circuit under test" can apply to multiple instances of different DUTs (designs under test) with different complexity and mutually (totally) independent (e.g., belonging to different sub-systems, design units etc. in a device).

As illustrated on the left-hand side of FIG. 1A, such test stimuli (IN_TEST_DATA signals) may have associated therewith (in a manner known per se to those of skill in the art): a TEST MODE indicator; SCAN_IN_EN and SCAN_OUT_EN enable signals for scan_in and scan_out enable; and a test capture signal TEST_CAPTURE.

As illustrated in FIG. 1B, test results for the circuits under test (200—see also FIG. 3 and the related discussion in the following) are collected and compressed in multiple input signature register blocks collectively designated 14.

Each such block 14 comprises a Multiple Input Signature Register (MISR-COMPRESSOR_1, COMPRESSOR_2, . . . , COMPRESSOR_N with an associated register (SIGNATURE_1_G, SIGNATURE_2_G, . . . , SIGNATURE_N_G) configured to have stored therein a "golden" value. At the end of a test campaign or a single test session such a "golden" value is compared with the contents of the associated MISR: that is with the golden value stored in the register SIGNATURE_X compared with the value stored in the MISR COMPRESSOR_X.

As illustrated in FIG. 1B, such test results may include (in a manner known per se to those of skill in the art) respective sets of data such as OUT_TEST_DATA_1, OUT_TEST_DATA_2, . . . , OUT_TEST_DATA_X1; OUT_TEST_DATA_X1+1, OUT_TEST_DATA_X1+2, OUT_TEST_DATA_X1+X2; . . . OUT_TEST_DATA_X1+X2+ . . . XN−1+1, OUT_TEST_DATA_X1+X2+ . . . XN−1+2, . . . , OUT_TEST_DATA_X1+X2+ . . . XN−1+XN.

As illustrated in FIG. 1, the test campaign of each instantiated LFSR 12 can be configured at runtime by associated control logic, LFSR_X_X_CNTRL (namely LFSR_1_1_CTRL, LFSR_1_2_CTRL, . . . , LFSR_M_NM_CTRL, collectively designated 16 in FIG. 1A) having internal control registers, LBIST_X_X_CTRL_REG (namely LBIST_1_1_CTRL_REG, LBIST_1_2_CTRL, . . . , LBIST_M_NM_CTRL, collectively designated 18 in FIG. 1A and having associated timers T) which are written via software through the interface APB.

Based on the configuration written therein, each control logic module LFSR_X_X_CNTRL (namely LFSR_1_1_CTRL, LFSR_1_2_CTRL, . . . , LFSR_M_NM_CTRL) in the set designated 16 drives all the output control signals for a certain LFSR 12 (LFSR_1_1, LFSR_1_2, . . . , LFSR_M_NM).

It is noted that the control signals driven by each bloc LFSR_X_X_CNTRL (16, namely LFSR_1_1_CTRL, LFSR_1_2_CTRL, . . . , LFSR_M_NM_CTRL) include, in addition to EN & CLR, also TEST_MODE, SCAN_IN, etc.

Briefly, FIG. 1A is thus exemplary of a circuit 10 comprising: a set of test stimulus generators 12, each generator in the set activatable to produce test stimulus signals IN_TEST_DATA for at least one circuit under test (200 in FIG. 3) as a function of test stimulus information loaded in a test stimulus register LFSR_1_1, LFSR_1_2, . . . , LFSR_M_NM in the generator 12, a set of controllers collectively designated 16, namely LFSR_1_1_CTRL, LFSR_1_2_CTRL, . . . , LFSR_M_NM_CTRL with each controller in the set configured to control loading of test stimulus information in the test stimulus register LFSR_1_1, LFSR_1_2, . . . , LFSR_M_NM in a respective generator in the set of test stimulus generators 12 as a function of test control information loaded in a respective control register LBIST_1_1_CTRL_REG, LBIST_1_2_CTRL_REG, . . . , LBIST_M_NM_CTRL_REG in a set of control registers designated collectively 18, a programming interface APB configured to load test programming information such as START, MULTI_CYCLE, TIMER MODE, N_

CAPTURE_CYCLES, N_TSESSIONS_x_x, N_TCYCLES_x_x as discussed in the following in the control registers 18, wherein the test stimulus generators 12 are activatable as a function of test programming information such as START, MULTI_CYCLE, TIMER MODE, N_CAPTURE_ CYCLES, N_TSESSIONS_x_x, N_TCYCLES_x_x loaded in the control registers 18 via the test programming interface APB.

In case of mismatches between the computed signature and the expected one as detected in signature control modules SIGN_1_CTRL, SIGN_2_CTRL, . . . , SIGN_N_CTRL, collectively designated 20 in FIG. 1B, an error signal ERR_1, ERR_2, . . . , ERR_N may be triggered out on the FCU interface FCU Intf. at the end of the test campaign.

Briefly, FIG. 1B is exemplary of the provision of: a set of input signature registers SIGNATURE_1_G, SIGNATURE_2_G, . . . , SIGNATURE_N_G, configured to store therein signature reference signals indicative of signature reference values received from the test programming interface (APB), signature control circuitry 14, 20, 22, 32 comprising a set 20 of signature control modules SIGN_1_CTRL, SIGN_2_CTRL, . . . , SIGN_N_CTRL coupled to respective ones of said input signature registers SIGNATURE_1_G, SIGNATURE_2_G, . . . , SIGNATURE_N_G.

As illustrated herein, the signature control circuitry is configured to: receive from the at least one circuit under test (200 in FIG. 3) test outcome signals OUT_TEST_DATA_1, . . . , OUT_TEST_DATA_X1+X2+ . . . +XN−1+XN in response to the stimulus signals IN_TEST_DATA being applied thereto via the generators 12, and produce (at 32, for instance) from the test outcome signals OUT_TEST_DATA_1, . . . , OUT_TEST_DATA_X1+X2+ . . . +XN−1+XN) received from the circuit or circuits 200 under test signature comparison signals COMPRESSOR_1, COMPRESSOR_2, . . . , COMPRESSOR_N that are compared in the signature control modules SIGN_1_CTRL, SIGN_2_CTRL, . . . , SIGN_N_CTRL with respective signature reference signals stored in the set of input signature registers SIGNATURE_1_G, SIGNATURE_2_G, . . . , SIGNATURE_N_G.

Error signals ERR_1, . . . , ERR_N may thus be produced in response to the signature comparison signals COMPRESSOR_1, COMPRESSOR_2, . . . , COMPRESSOR_N produced from the test outcome signals OUT_TEST_DATA_1, . . . , OUT_TEST_DATA_X1+X2+ . . . +XN−1+XN received from the at least one circuit under test 200 failing to match respective signature reference signals stored in the input signature registers SIGNATURE_1_G, SIGNATURE_2_G, . . . , SIGNATURE_N_G.

It is noted that one or more embodiments are primarily concerned with (self-test) architecture as discussed rather than with the criteria adopted for selecting/programming the signature reference signals stored in the input signature registers SIGNATURE_1_G, SIGNATURE_2_G, . . . , SIGNATURE_N_G and/or in the check for match or mismatch as performed in the signature control modules SIGN_1_CTRL, SIGN_2_CTRL, . . . , SIGN_N_CTRL, collectively designated 20 in FIG. 1B.

These criteria may be selected as a function of factors such as the nature and the type of the circuits under test, the intended application, the type of test(s) being performed and so on. These criteria can be selected in a wide variety of possible options known to those of skill in the art by otherwise noting that test architecture as discussed herein is largely "transparent" to these criteria.

As illustrated, an internal status register 22 can be provided for a finer error analysis, with a status bit for each test cluster.

The end of an LFSR test campaign can be signaled by a pulse using an interrupt interface, one interrupt channel per instantiated LFSR.

Each sub-block in the architecture of the circuit 10 as discussed herein and the associated (static) configuration parameters can be defined in such a way as to adapt the architecture to a variety of possible test criteria and scenarios (for instance, in view of the concept underlying the test session, the development of the test campaign and/or the test clusters adopted for test purposes).

The structure and the sub-blocks of the architecture of the circuit 10 as discussed herein facilitates defining a set of static configuration parameters which overcome various drawbacks of conventional solutions.

Table I, shown below, contains a possible list of configuration parameters that can be made available to a designer.

TABLE I

CONFIGURATION PARAMETERS

| PARAMETER | TYPE | DESCRIPTION | NOTE |
| --- | --- | --- | --- |
| N_LFSR_TYPES | integer | Number of different LFSR types × pattern generation | |
| LFSR_TYPE[N_LFSR_TYPES] | array of integers | LFSR type information (length) | |
| N_LFSR[N_LFSR_TYPES] | array of integers | Number of instances × LFSR type | |
| N_LFSR_TOT | integer | Total number of LFSR instances | sum(N_LFSR) |
| LFSR_P[N_LFSR_TOT] | array of integers | LFSR output parallelism for each LFSR instance | |
| N_T_CLUSTER[N_LFSR_TOT] | array of integers | Number of test clusters concurrently managed by each LFSR | |
| N_T_CLUSTER_TOT | integer | Total number of test clusters (CUTs) | sum(N_T_CLUSTER) |
| SIN_L[N_T_CLUSTER_TOT] | array of integers | Max length of the CUTs input scan chains for each test cluster | |
| SOUT_L[N_T_CLUSTER_TOT] | array of integers | Max length of the CUTs output scan chains for each test cluster | |
| #N_TSESSIONS[N_T_CLUSTER_TOT] | array of integers | Max number of test sessions programmable for each test cluster | |

TABLE I-continued

CONFIGURATION PARAMETERS

| PARAMETER | TYPE | DESCRIPTION | NOTE |
|---|---|---|---|
| #N_MISR_TYPES | integer | Number of different MISR types × signature compression | |
| MISR_TYPE[N_MISR_TYPES] | array of integers | MISR type information (length) | |
| N_MISR[N_MISR_TYPES] | array of integers | Number of instances × MISR type | |
| N_MISR_TOT | integer | Total number of MISR instances N_MISR_TOT <= N_T_CLUSTER_TOT | sum(N_MISR) |
| MISR_P[N_MISR_TOT] | array of integers | MISR input parallelism for each MISR instance | |
| TINPUTS_P[N_T_CLUSTER_TOT]. | array of integers | Number of input test data for each test cluster | |
| N_MISR_TINPUTS[N_MISR_TOT] | array of integers | Number of input test data for each MISR Sum(N_MISR_TINPUTS) = N_T_CLUSTER_TOT | |
| TIMER_MODE[N_LFSR_TOT] | array of integers | Enable/disable an internal timer × LFSR | optional |

In the case of a 1D vector parameter, the [ ] notation is used to express its dimension while sum( ) is used to indicate the sum of the array elements.

In detail, in an exemplary embodiment these parameters may include: an integer indicating the number of different LFSR types present inside the architecture, N_LFSR_TYPES; a vector of integers, one for each type, encoding the LFSR type information (e.g., 32 for a 32-bit LFSR, 16 for a 16-bit LFSR and so on), LFSR_TYPE [N_LFSR_TYPES]; a vector of integers indicating the number of instances for each LFSR type, N_LFSR[N_LFSR_TYPES], where the total number of instances is so given by the internal derived parameter, N_LFSR_TOT=sum(N_LFSR), an internal parameter being a parameter whose value is automatically computed by the code and cannot be set by the user; a vector of integers, one for each LFSR instance, indicating its output parallelism, LFSR_P[N_LFSR_TOT]; and a vector of integers, one for each LFSR instance, indicating the number of test clusters handled in parallel by each LFSR, N_T_CLUSTER[N_LFSR_TOT].

As discussed herein, a test cluster is a group made of a certain number #N of CUTs serially tested using a common test session repeated #N times. Usually the CUTs are of the same type and a dedicated test wrapper is inserted for each test cluster. While a test session is the set of the generated input test data, the total number of test clusters is given by the internal derived parameter: N_T_CLUSTER_TOT=sum (N_T_CLUSTER).

In accordance with the exemplary embodiment, the parameters may further include: a vector of integers, one for each test cluster, indicating the maximum length of the CUTs input scan-chains associated to that particular cluster, SIN_L[N_T_CLUSTER_TOT]; a vector of integers, one for each test cluster, indicating the maximum length of the CUTs output scan-chains associated to that particular cluster, SOUT_L[N_T_CLUSTER_TOT]; a vector of integers, one for each test cluster, indicating the maximum number of test sessions that can be programmed to be executed serially for that particular cluster, #N_TSESSIONS[N_T_CLUSTER_TOT]; an integer indicating the number of different instantiated signature types inside the architecture, #N_MISR_TYPES; a vector of integers, one for each type, encoding the signature type information (e.g. 32 for a 32-bit MISR, 16 for a 16-bit MISR and so on), MISR_TYPE[N_MISR_TYPES]; and a vector of integers indicating the number of instances for each signature type, N_MISR [N_MISR_TYPES]. The total number of instances is given by the internal derived parameter: N_MISR_TOT=sum (N_MISR) if <=N_T_CLUSTER_TOT, otherwise an error is flagged.

Also in accordance with the exemplary embodiment, the parameters may further include: a vector of integers, one for each signature instance, indicating its input parallelism, MISR_P[N_MISR_TOT]; a vector of integers, one for each input test data signal, indicating its parallelism, N_TINPUTS_P[N_T_CLUSTER_TOT], the number of different input test data being equal to the total number of test clusters; a vector of integers, one for each signature, indicating the number of input test data signals/test clusters associated to that particular signature, N_MISR_TINPUTS[N_MISR_TOT], sum(N_MISR_TINPUTS) being equal to N_T_CLUSTER_TOT, otherwise an error is flagged; and an array of Boolean parameters, TIMER_MODE[N_LFSR_TOT], used to enable/disable the presence of the internal timer for each LFSR.

A detailed description of exemplary sub-blocks included in architecture as illustrated in FIGS. 1A and 1B will now be provided together with a description of the possible impact of the associated configuration parameters.

The test stimuli (left-hand side of FIG. 1A) used to fill the test wrapper input scan-chains (as discussed in the following in connection with FIG. 3) are pseudo-randomly generated using internal LFSRs such as 12 whose type, number and output parallelism is defined statically.

Output parallelism is found to represent a useful approach for tuning the test time as this facilitates changing the time involved in filling the input scan-chains. The choice of LFSR type is related to the coverage targets and the CUT complexity.

Controller modules (such as those collectively designated 18 in FIG. 1A) can be automatically generated and associated to each LFSR instance, in order to drive its control signals and the control signals of the associated external test wrappers/clusters (e.g., TEST_CAPTURE, SCAN_IN_EN, SCAN_OUT_EN, TEST_MODE, and so on).

Figure 2:
FIG. 2 is exemplary of fields which may be provided in registers included in architecture as illustrated in FIGS. 1A and 1B.

Each controller module 16 can be programmed via SW by means of a dedicated control register (LBIST_1_1_CTRL_REG, LBIST_1_2_CTRL_REG, . . . , LBIST_M_NM_CTRL_REG) out of the resisters collectively designated 18 and having the structure illustrated in FIG. 2 for a generic register LBIST_x_x_CTRL_REG.

As illustrated in FIG. 2, in addition to a START bit, MULTI_CYCLE and TIMER MODE fields and a number of N_CAPTURE_CYCLES, for the i-th controller there is a number of N_TSESSIONS and N_TCYCLES register fields (the suffix is omitted for simplicity) equal to the number of associated test clusters, N_T_CLUSTER[i].

Table II, shown below, contains a detailed description of the fields in a register LBIST_x_x_CTRL_REG.

TABLE II

FIELDS IN A REGISTER LBIST_X_X_CTRL_REG.

| Field | Type | Description |
| --- | --- | --- |
| START | Boolean | To start the test campaign of a certain number of test sessions |
| MULTI_CYCLE | Boolean | 2 clock periods in the capture cycle to reduce the actual clock frequency (in case of critical timing paths) |
| TIMER MODE | Boolean | Timer mode to trigger the test campaign on regular time interval |
| N_CAPTURE_CYCLES | Integer | Number of capture cycles (for almost full-scan design) |
| N_TSESSIONS_x_x | array of integers | Number of test sessions <= N_TSESSIONS[i] for each test cluster |
| N_TCYCLES_x_X | array of integers | Number of test cycles <= N_TSESSIONS[i] for each test session |

The START bit is used to start via SW a test campaign that is made of a certain number of test sessions whose value can be programmed using the relative register field, N_TSESSIONS. Such value does not exceed the statically defined maximum value, N_TSESSIONS[i].

For each test session is also possible to program a desired number of test cycles, N_TCYCLES, which facilitates tuning the test coverage.

A timer mode if (and only if) TIMER_MODE[i] is active, is also made available to trigger test campaigns at regular time intervals without SW intervention. In that case, the start signal may be obtained from an end of counter (EOC) signal of an internal counter whose period can be programmed by SW.

The N_CAPTURE_CYCLES register field is used to generate a configurable number of capture cycles, which is useful to increase the test coverage when the CUT contains sequential elements. The MULTI_CYCLE field, if activated, can be used to insert an extra clock cycle in the test capture signal generation.

In an advantageous manner, the control registers LBIST_1_1_CTRL_REG, LBIST_1_2_CTRL_REG, . . . , LBIST_M_NM_CTRL_REG may be configured to receive from the programming interface APB test programming information comprising: a number of test sessions N_TSESSIONS_x_x for which a test stimulus generator is activated to produce test stimulus signals IN_TEST_DATA for at least one circuit under test 200, and/or a number of test cycles N_TCYCLES for which a test stimulus generator 12 is activated in a test session for at least one circuit under test 200, and/or timed test mode activation information TIMER_MODE to activate a test stimulus generator 12 at programmed times, and/or capture mode information N_CAPTURE_CYCLES indicative of a number of capture cycles of output test signals for at least one circuit under test 200.

In this case, the control registers LBIST_1_1_CTRL_REG, LBIST_1_2_CTRL_REG, . . . , LBIST_M_NM_CTRL_REG can be configured to receive, from the test programming interface APB and in addition to test control information comprising capture mode information, N_CAPTURE_CYCLES indicative of a number of capture cycles of output test signals for at least one circuit under test 200 and also information (in the MULTI_CYCLE field) to insert extra cycles in the capture mode information N_CAPTURE_CYCLES.

Figure 3:
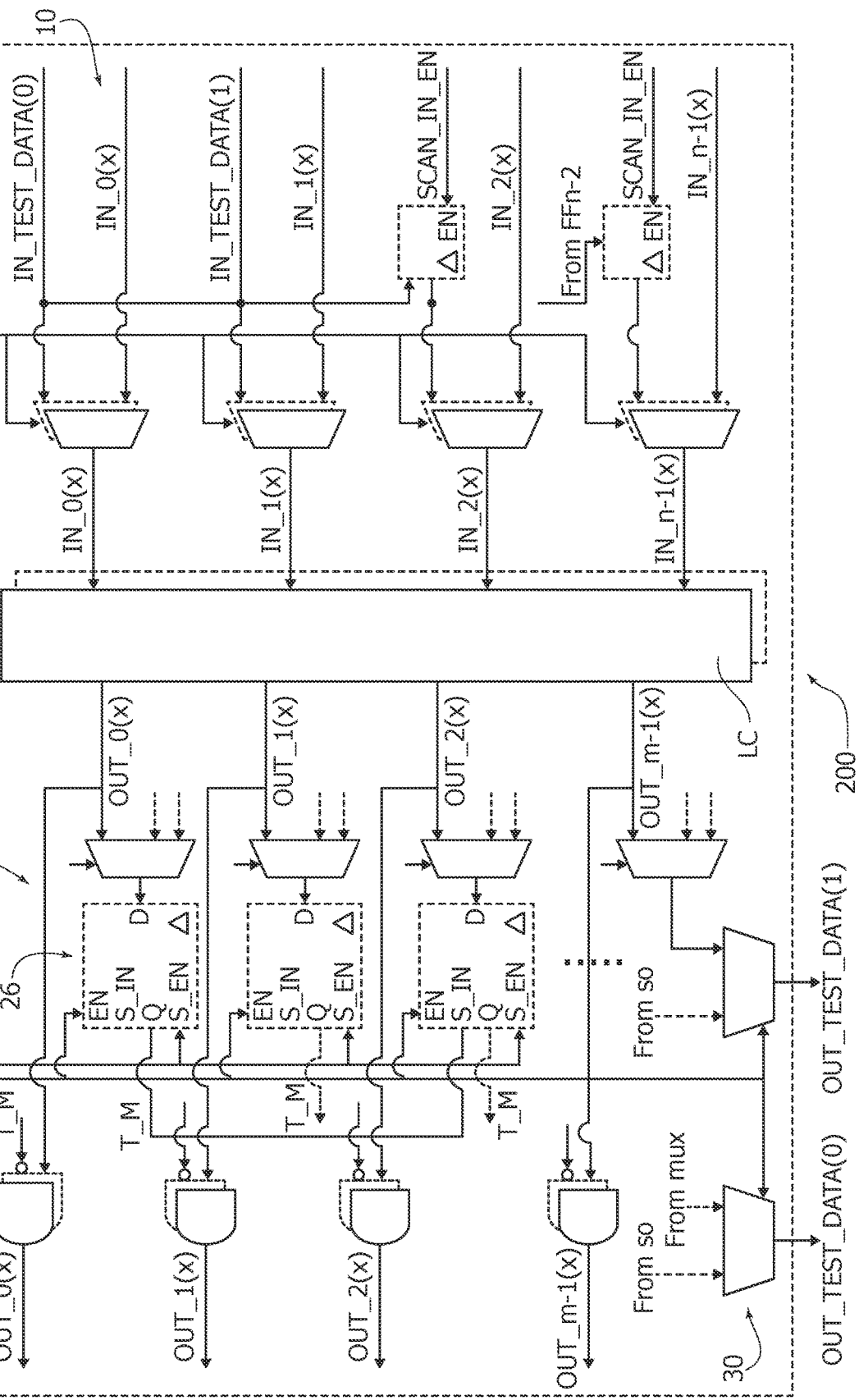
FIG. 3 is a block diagram of a test circuit configured to co-operate with architecture according to embodiments of the present description.

FIG. 3 is illustrative of an exemplary test wrapper 200 configured to receive (for each test cluster) to collect the input test data coming from an associated LFSR (out of LFSR_1_1, LFSR_1_2, . . . , LFSR_M_NM, collectively designated 12 in FIG. 1A) and transfer them to an input scan-chain and provide the generated test vectors to the CUTs.

As detailed in FIG. 3 (and otherwise known in scan chain operation), the input test data IN_TEST_DATA(0), IN_TEST_DATA(1), . . . from architecture 10 as illustrated in FIGS. 1A and 1B can be applied to nodes in a logic circuitry LC (a HW safety mechanism or functional block, mostly combinational, for instance) which provides the circuits under test or CUTs.

The input test data IN_TEST_DATA(0), IN_TEST_DATA(1), . . . can be applied to the logic circuitry LC as an alternative to certain ones out "functional" signals IN_0($x$), IN_1($x$), IN_2($x$), . . . , IN_n-1(x) to homologous nodes IN_1($x$), IN_1($x$), IN_2($x$), IN_n-1(x) in the logic circuitry LC via multiplexers collectively designated 24 acting under the control of a test mode signal T_M which is asserted to activate test mode operation.

Signals OUT_0($x$), OUT_1($x$), OUT_2 ($x$), . . . , OUT_n-1(x) from the nodes of the logic circuitry LC are applied to multiplexers 26A in a set of flip-flops 26 connected in a cascaded scan chain arrangement controlled by SCAN_OUT_EN and TEST_CAPTURE signals (generated in a manner known per se to those of skill in the art).

Reference 28 denotes collectively logic gates (AND gates, for instance) controlled by the test mode signal T_M (e.g. negated) to transfer the extract the "functional" outputs OUT_0($x$), OUT_1($x$), OUT_2($x$), . . . , OUT_m-1(x) from the logic circuitry LC.

As exemplified in FIG. 3, output test data OUT_TEST_DATA(0), OUT_TEST_DATA(1), . . . are obtained from the test wrapper 200 (e.g. at multiplexers 30 coupled to the scan-chain 26).

Briefly, a scan chain such as illustrated at 26 comprises a set of flip-flops connected together to act as a sort of shift register when the design is in a Shift Test Mode (that is, with a SCAN_OUT_EN enable signal asserted).

Referring for simplicity to an input and output parallelism equal to 1, the first flip-flop of the scan chain is connected to a scan input and the last flip-flop in the scan chain is connected to a scan output.

Scan chain operation can be regarded as involving three stages, namely scan in (this is the scan_in shift mode phase where the FFs in the chain are loaded through scan in pins serially), capture (the design is kept in functional timing mode and test pattern response is captured) and scan out (this is the scan-out shift mode phase where FFs in the chain are un-loaded through scan out pins; scan-in phase can proceed concurrently).

Structure and operation of a scan chain as discussed previously, including a SCA_IN_EN enable signals and a signal derive from one of the flip-flops (e.g., FFn-2) being applied to the multiplexers 24, is otherwise conventional in the art.

Reference may be made in that respect, merely by way of example, to S. Sharma: "Scan Chains: PnR Outlook" (see design-reuse.com), which is incorporated herein by reference.

For the purposes herein it will be appreciated that the CUT which is selected (in the network LC) is identified via signal encoding, one-hot encoding, the index of the test session, and the test mode signal T_M in FIG. 3, which is driven by the LFSR controller.

The same signal T_M is used to route the CUT outputs to the wrapper output scan chain 26 and at the same time to gate them (via the gates 28) during a test session in order to avoid unwanted interferences with the rest of the SoC/IP arrangement.

The number of FFs of the scan-chain of the i-th test wrapper can be changed automatically as a function of the values set for: LFSR_P[i] and N_TINPUTS_P[i] which is advantageous in terms of area cost As illustrated on the right-hand side of FIG. 1B, so-called internal "funnels", FUNNEL_1, FUNNEL_2, . . . , FUNNEL_N collectively designated 32 can be used to associate a respective set of data, such as OUT_TEST_DATA_1, OUT_TEST_DATA_2, . . . , OUT_TEST_DATA_X1;
OUT_TEST_DATA_X1+1, OUT_TEST_DATA_X1+2, OUT_TEST_DATA_X1+X2;
. . .
OUT_TEST_DATA_X1+X2+ . . . XN−1+1, OUT_TEST_DATA_X1+X2+ . . . XN−1+2, . . . , OUT_TEST_DATA_X1+X2+ . . . XN−1+XN, to a single signature register SIGNATURE_1_G, SIGNATURE_2_G, . . . , SIGNATURE_N_G (see 14 in FIG. 1B) with its own parallelism.

Figure 4:
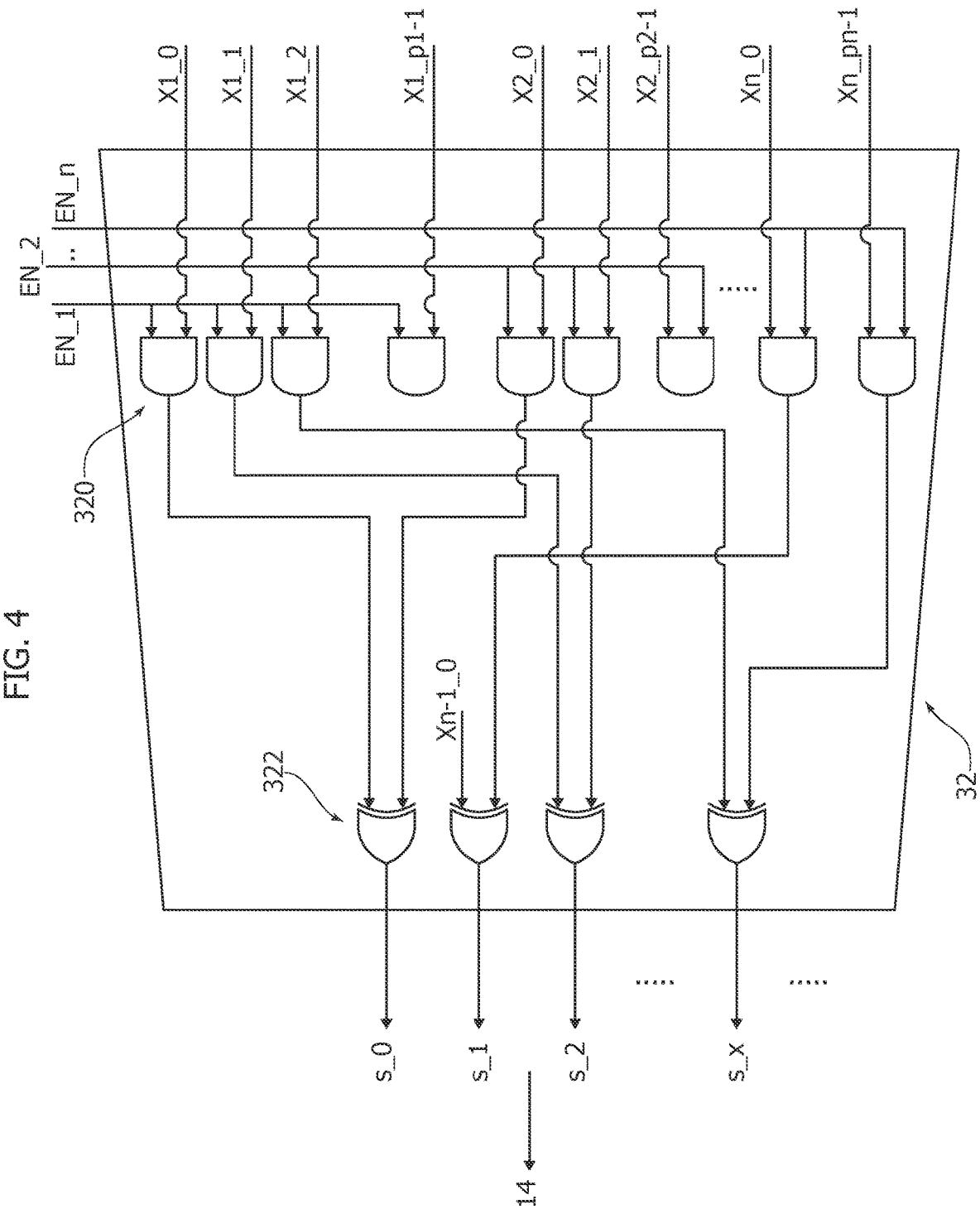
FIG. 4 is a circuit diagram exemplary of parts of circuit architecture of FIG. 1B.

These funnels may be implemented with a structure as illustrated in FIG. 4.

In the arrangement exemplified in FIG. 4, the data from one the sets above, briefly indicated as X1_0, X1_1, X1_2, . . . , X1_p1−1; X2_0, X2_1, . . . , X2_p2−1; . . . Xn_0, . . . , Xn_pn−1 are gated via AND gates 320 under the control of enabling signals EN_1, EN_2, . . . , EN_n (one for each input signal) produced by funnel configuration registers (funnel_x_cfg, configured via software through the interface APB) designated 32_1, 32_2, . . . , 32_N in FIG. 1B to be then supplied to EX-OR logic circuitry 322 which generates "funneled" signals s_0, s_1, s_2, . . . , s_x to be applied to the MISR blocks COMPRESSOR_X (COMPRESSOR_1, COMPRESSOR_2, . . . , COMPRESSOR_N) in FIG. 1B.

As illustrated in FIG. 4 each X-OR gate in the circuitry 322 may receive two "homologous" inputs such as X0_0 and X2_0.

After the gating stage (that is, the AND gates collectively designated 320), a compression stage is provided including x-bit X-OR gates collectively designated 322. There, the value x denotes the compression ratio of the funnels 32 (FIG. 1B), that is, the ratio between the total number of input bits to a funnel (p1+p2+ . . . +pn) and the total number of output bits from the funnel.

This last value is equal to the input parallelism of the associated signature and is statically defined by the MISR_P [N_MISR_TOT] parameter. In FIG. 4, by way of non-limiting example, x=2: in fact each X-OR gate 322 is shown to have two inputs.

As an implementation specification, the ratio x is an integer: in case x=3, for instance, X-OR gates 322 with three inputs are used.

As represented in FIG. 4 (schematically, in order to avoid an unduly complicated representation) the connections between the AND gates 320 and the X-OR gates 322 results in grouping the output signals from the AND gates 320 in groups of x elements each starting from bit 0 of signal X1 and proceeding with bit 0 of signal X2, and so on up to bit 0 of signal Xn and then resuming with bit 1 of signal X1, then with bit 1 of signal X2, and so on up to bit 1 of signal Xn, proceeding in the same way for all the bits in the signals X1 to Xn.

When all the bits of a signal are connected, this signal is excluded from the process and a jump is made to the bit of the first subsequent signal still to be managed. In that way signals with different amplitudes can be grouped together.

FIG. 4 is thus exemplary of a possible, non mandatory, implementation of signature control circuitry configured to receive plural sets of test outcome signals from the circuit under test (200 in FIG. 3, with plural instances of the circuit 200 involved to have plural output sets) in response to the stimulus signals IN_TEST_DATA being applied to the at least one circuit under test with such compressor circuitry configured to produce from each one of the plural sets of test outcome signals from the at least one circuit under test 200 a respective signature comparison signal COMPRESSOR_1, COMPRESSOR_2, . . . , COMPRESSOR_N for comparison with a respective reference signal in the set of signature control modules SIGN_1_CTRL, SIGN_2_CTRL, . . . , SIGN_N_CTRL.

A possible mismatch between input and output data parallelism can be handled with or without adding extra data compression, in addition to the corresponding MISR processing, during a test campaign.

Adding compression may somehow affect test coverage, with possible error masking due to aliasing, but at the same time decreases test time.

Which one of the funnel inputs is active is given by a dedicated configuration register, the funnel/signature configuration register 32_1, 32_2, . . . , 32_N in FIG. 1B, with one configuration register for funnel/signature instance.

The test output data generated during a test session or a test campaign con be compressed in multiple input signature registers (see 14 in FIG. 1B), whose parallelism is statically defined as the type and number of signatures which are instantiated.

Each MISR block COMPRESSOR_1, COMPRESSOR_2, . . . , COMPRESSOR_N has associated a respective register SIGNATURE_1_G, SIGNATURE_2_G, . . . , SIGNATURE_N_G, which can be written via SW through the interface APB in order to store the expected/golden signature of a single test session or of an entire test campaign.

The comparison between the computed "signature" values resulting from testing as stored COMPRESSOR_1, COMPRESSOR_2, . . . , COMPRESSOR_N and the "golden" values stored in respective registers such as SIGNATURE_1_G, SIGNATURE_2_G, . . . , SIGNATURE_N_G, can be configured via SW, using the funnel/signature configuration registers, at the end of a single test session or at the end of the entire test campaign of the associated LFSRs.

It is once more noted that the embodiments are primarily concerned with (self-test) architecture rather than with the criteria adopted for obtaining these test signatures and/or for performing match or mismatch checks in the signature control modules.

These criteria may be selected as a function of factors such as the nature and the type of the circuits under test, the intended application, the type of test(s) being performed and so on. These criteria can be selected in a wide variety of possible options known to those of skill in the art by otherwise noting that test architecture as discussed herein is largely "transparent" to these criteria.

Such an architecture is thus applicable to a wide variety of devices comprising: a first circuit 10 as exemplified in FIG. 1A and FIG. 1B, and at least one second circuit 200 as exemplified in FIG. 3 and configured to be brought to a test mode (signal T_M) wherein during the test mode the at least one second circuit is coupled: to the set of test stimulus generators 12 in the first circuit 10 to receive therefrom the test stimulus signals (for instance IN_TEST_DATA and signals associated thereto, as discussed previously), and to the signature control circuitry 14, 20, 22, 32 to provide thereto test outcome signals such as OUT_TEST_DATA_1, . . . , OUT_TEST_DATA_X1+X2+ . . . +XN−1+XN in response to the stimulus signals being applied thereto.

As illustrated in FIG. 3, the at least one second circuit 200 comprises: logic circuitry LC that is a candidate for testing, and scan-chain circuitry 24, 26 configured to: apply to the logic circuitry LC, during the test mode, test input data IN_0($x$), IN_1($x$), . . . , IN_n−1(x) as a function of the test stimulus signals from the test stimulus generators 12 in the first circuit 10, and recover from the logic circuitry LC during the test mode test output signals OUT_0($x$), OUT_1 ($x$), . . . , OUT_M−1(x) and apply the test output signals as test outcome signals OUT_TEST_DATA_1, . . . , OUT_TEST_DATA_X1+X2+ . . . +XN−1+XN to the signature control circuitry 14, 20, 22, 32 in the first circuit 10.

Architecture as discussed herein and the associated set of RTL configuration parameters is advantageous in testing various types and configurations of CUTs both at IP and SoC level overcoming certain limitations of conventional solutions. This applies particularly when many different types and instances of simple CUTs are concurrently handled by testing architecture without duplicating the LBIST controllers.

For instance, various aspects discussed herein were successfully used in connection with EDPA safety mechanisms as disclosed in Italian Patent Application No. 102020000009358 and Italian Patent Application No. 102020000029759 (not yet available to the public at the time of filing of the instant application) complying with ISO 26262 ASIL-D coverage specifications for LPFs with reduced area overhead and test time.

Without prejudice to the underlying principles, the details and embodiments may vary, even significantly, with respect to what has been described by way of example only without departing from the extent of protection.

What is claimed is:

1. A circuit comprising:
a set of test stimulus generators, each of the set of test stimulus generators activatable to produce test stimulus signals for at least one circuit under test as a function of test stimulus information loaded in a test stimulus register in the test stimulus generator;
a set of controllers, each of the set of controllers configured to control loading of test stimulus information in the test stimulus register in a respective generator in the set of test stimulus generators as a function of test control information loaded in a respective control register in a set of control registers;
a test programming interface configured to load test programming information in the control registers in the set of control registers, wherein the test stimulus generators in the set of test stimulus generators are activatable as a function of test programming information loaded in the control registers in the set of control registers via the test programming interface;
a set of input signature registers, configured to store therein signature reference signals indicative of signature reference values received from the test programming interface; and signature control circuitry comprising a set of signature control modules coupled to respective ones of the set of input signature registers, the signature control circuitry being separate from the set of controllers, the signature control circuitry configured to
receive test outcome signals from the at least one circuit under test in response to the test stimulus signals being applied thereto,
produce signature comparison signals from the test outcome signals received from the at least one circuit under test,
compare in the set of signature control modules the signature comparison signals produced from the test outcome signals received from the at least one circuit under test with respective signature reference signals in the set of input signature registers, and
produce error signals in response to the signature comparison signals produced from the test outcome signals received from the at least one circuit under test failing to match with respective signature reference signals in the set of input signature registers,
wherein the signature control circuitry further comprises compressor circuitry configured to receive plural sets of test outcome signals from the at least one circuit under test in response to the test stimulus signals being applied thereto, the compressor circuitry comprising:
two gated via AND gates under control of respective enabling signals produced by one or more funnel configuration registers, wherein each of the one or more funnel configuration registers is configured via software in the test programming interface to associate a respective set of data to a single input signature register; and
an XOR gate coupled to respective outputs of the two gated via AND gates.

2. The circuit of claim 1, wherein the control registers in the set of control registers are configured to receive test programming information from the test programming interface comprising:
a number of test sessions for which a test stimulus generator in the set of test stimulus generators is activated to produce the test stimulus signals for the at least one circuit under test,
a number of test cycles for which a test stimulus generator in the set of test stimulus generators is activated in a test session for the at least one circuit under test,
timed test mode activation information to activate a test stimulus generator in the set of test stimulus generators at programmed times, or
capture mode information indicative of a number of capture cycles of output test signals for the at least one circuit under test.

3. The circuit of claim 2, wherein the control registers in the set of control registers are configured to receive test control information from the test programming interface comprising capture mode information indicative of the number of capture cycles of output test signals for the at least one circuit under test as well as information to insert extra cycles in the capture mode information.

4. The circuit of claim 1, wherein each of the set of test stimulus generators comprises a linear-feedback shift register as the test stimulus register in the test stimulus generator.

5. The circuit of claim 1, wherein the set of test stimulus generators are configured to produce the test stimulus signals for the at least one circuit under test having coupled therewith signals comprising:

a test mode indicator signal;
scan_in and scan_out enable signals; or
a test capture signal.

6. The circuit of claim 1, wherein the compressor circuitry is configured to produce from each one of the plural sets of test outcome signals from the at least one circuit under test a respective signature comparison signal for comparison with a respective reference signal in the set of signature control modules.

7. A device, comprising:
the circuit according to claim 1; and
at least one additional circuit configured to be brought to a test mode wherein during the test mode the at least one additional circuit is coupled
to the set of test stimulus generators in the circuit to receive therefrom the test stimulus signals, and
to the signature control circuitry to provide thereto the test outcome signals in response to the test stimulus signals being applied thereto.

8. The device of claim 7, wherein the at least one additional circuit comprises:
logic circuitry to be tested; and
scan-chain circuitry configured to
apply test input data to the logic circuitry during the test mode, as a function of the test stimulus signals from the set of test stimulus generators in the circuit,
recover test output signals from the logic circuitry during the test mode, and
apply the test output signals as test outcome signals to the signature control circuitry in the circuit.

9. A circuit comprising:
a set of test stimulus generators configured to produce test stimulus signals for at least one circuit under test, wherein a first test stimulus generator of the set of test stimulus generators comprises a first linear-feedback shift register as the test stimulus register in the first test stimulus generator and wherein a second test stimulus generator of the set of test stimulus generators comprises a second linear-feedback shift register as the test stimulus register in the first test stimulus generator, the first linear-feedback shift register being a 32-bit linear-feedback shift register and the second linear-feedback shift register being a 16-bit linear-feedback shift register;
a set of controllers coupled to the set of test stimulus generators and configured to control loading of test stimulus information in the set of test stimulus generators; and
a test programming interface coupled to the set of controllers and configured to load test programming information in the set of controllers, the set of test stimulus generators being configurable at runtime by the set of controllers via software using the test programming interface;
a set of input signature registers, configured to store therein signature reference signals indicative of signature reference values received from the test programming interface; and
signature control circuitry comprising a set of signature control modules coupled to respective ones of the set of input signature registers, the signature control circuitry being separate from the set of controllers, wherein the signature control circuitry further comprises compressor circuitry configured to receive plural sets of test outcome signals from the at least one circuit under test in response to the test stimulus signals being applied thereto, the compressor circuitry comprising:

two gated via AND gates under control of respective enabling signals produced by one or more funnel configuration registers; and
an XOR gate coupled to respective outputs of the two gated via AND gates.

10. The circuit of claim 9,
wherein the signature control circuitry is configured to
receive test outcome signals from the at least one circuit under test in response to the test stimulus signals being applied thereto,
produce signature comparison signals from the test outcome signals received from the at least one circuit under test,
compare in the set of signature control modules the signature comparison signals produced from the test outcome signals received from the at least one circuit under test with respective signature reference signals in the set of input signature registers, and
produce error signals in response to the signature comparison signals produced from the test outcome signals received from the at least one circuit under test failing to match with respective signature reference signals in the set of input signature registers.

11. The circuit of claim 10, wherein the compressor circuitry is configured to produce from each one of the plural sets of test outcome signals from the at least one circuit under test a respective signature comparison signal for comparison with a respective reference signal in the set of signature control modules.

12. The circuit of claim 9, further comprising:
a set of control registers configured to receive test programming information from the test programming interface comprising a number of test sessions for which a test stimulus generator in the set of test stimulus generators is activated to produce the test stimulus signals for the at least one circuit under test.

13. The circuit of claim 9, further comprising:
a set of control registers configured to receive test programming information from the test programming interface comprising a number of test cycles for which a test stimulus generator in the set of test stimulus generators is activated in a test session for the at least one circuit under test.

14. The circuit of claim 9, further comprising:
a set of control registers configured to receive test programming information from the test programming interface comprising timed test mode activation information to activate a test stimulus generator in the set of test stimulus generators at programmed times.

15. The circuit of claim 9, further comprising:
a set of control registers configured to receive test programming information from the test programming interface comprising capture mode information indicative of a number of capture cycles of output test signals for the at least one circuit under test.

16. The circuit of claim 15, wherein the set of control registers are further configured to receive test control information from the test programming interface comprising information to insert extra cycles in the capture mode information.

17. A method, comprising:
applying test stimulus signals to at least one circuit under test, the test stimulus signals being produced in a set of test stimulus generators as a function of test stimulus information loaded in test stimulus registers in the set of test stimulus generators, wherein the test stimulus generators are linear-feedback shift registers configurable to include different numbers of types, each type having a different number of bits;

controlling loading of test stimulus information in the test stimulus registers of the test stimulus generators as a function of test programming information loaded in a respective control register in a set of control registers with a set of controllers, the test stimulus generators in the set of test stimulus generators being activated as a function of the test programming information loaded in the control registers in the set of control registers;

receiving, by a compressor circuit, plural sets of test outcome signals from the at least one circuit under test in response to the test stimulus signals being applied thereto with signature control circuitry, the signature control circuitry being separate from the set of controllers, the plural sets of test outcome signals passing through:
- two gated via AND gates under control of respective enabling signals produced by one or more funnel configuration registers; and
- an XOR gate coupled to respective outputs of the two gated via AND gates;

producing signature comparison signals from the test outcome signals received from the at least one circuit under test;

comparing the signature comparison signals produced from the test outcome signals received from the at least one circuit under test with respective programmable signature reference signals stored in a set of input signature registers; and producing error signals in response to the signature comparison signals produced from the test outcome signals received from the at least one circuit under test failing to match with the respective programmable signature reference signals stored in the set of input signature registers.

18. The method of claim 17, wherein the test programming information comprises:
- a number of test sessions for which a test stimulus generator in the set of test stimulus generators is activated to produce the test stimulus signals for the at least one circuit under test;
- a number of test cycles for which a test stimulus generator in the set of test stimulus generators is activated in a test session for the at least one circuit under test;
- timed test mode activation information to activate a test stimulus generator in the set of test stimulus generators at programmed times; or
- capture mode information indicative of a number of capture cycles of output test signals for the at least one circuit under test.

19. The method of claim 18, wherein the control registers in the set of control registers are further configured to receive test control information comprising the capture mode information indicative of the number of capture cycles of output test signals for the at least one circuit under test as well as information to insert extra cycles in the capture mode information.

20. The method of claim 17, further comprising:
producing, by the compressor circuit a respective signature comparison signal for comparison with a respective programmable signature reference signal from each one of the plural sets of test outcome signals from the at least one circuit under test.

* * * * *